United States Patent [19]

Landis et al.

[11] Patent Number: 4,901,205
[45] Date of Patent: Feb. 13, 1990

[54] HOUSING FOR ELECTRONIC COMPONENTS

[75] Inventors: Donald E. Landis; Jay D. Atkinson; Dale R. Lyons; Todd J. Wilhelm; David C. Wills, all of Cambridge, Ohio

[73] Assignee: NCR Corporation, Dayton, Ohio

[21] Appl. No.: 239,818

[22] Filed: Sep. 2, 1988

[51] Int. Cl.[4] .............................................. H05K 9/00
[52] U.S. Cl. .................................. 361/424; 174/35 R; 174/51; 361/399; 361/413; 361/415
[58] Field of Search .................................. 174/51, 35 R; 312/357 SK; 361/383–384, 394–396, 399, 412, 413, 415, 424

[56] References Cited

U.S. PATENT DOCUMENTS

| | | | |
|---|---|---|---|
| 3,811,154 | 5/1974 | Lindeman et al. | 361/412 |
| 3,836,703 | 9/1974 | Coules | 361/412 |
| 4,498,717 | 2/1985 | Reimer | 361/413 |
| 4,574,332 | 3/1986 | Calabro | 361/415 |
| 4,585,122 | 4/1986 | Stegenga | 206/334 |
| 4,652,969 | 3/1987 | Stegenga | 361/384 |
| 4,672,510 | 6/1987 | Castner | 361/415 |
| 4,717,216 | 1/1988 | Hornak | 312/257 R |
| 4,744,006 | 5/1988 | Duffield | 361/413 |
| 4,745,524 | 5/1988 | Patton, III | 361/399 |

FOREIGN PATENT DOCUMENTS

0090224 5/1983 Japan .................................. 361/395

Primary Examiner—Gregory D Thompson
Attorney, Agent, or Firm—Wilbert Hawk, Jr.; Albert L. Sessler, Jr.

[57] ABSTRACT

A housing for containing a plurality of circuit boards in a compact arrangement includes upper and lower housing portions which can be secured to each other by easily releasable securing devices. A first circuit board disposed on a base surface of the lower housing portion, and a vertically disposed bus circuit board mounted in a frame on the upper housing portion and having connectors electrically engageable with receptacles on the first circuit board. A plurality of horizontally disposed additional circuit boards having connectors electrically engageable with horizontally disposed receptacles secured to both sides of the bus circuit board, at least certain of the additional circuit boards having a width extending outwardly from the connectors which is greater than the vertical distance between the first circuit board and a portion of the upper housing portion.

22 Claims, 7 Drawing Sheets

HOUSING FOR ELECTRONIC COMPONENTS

BACKGROUND OF THE INVENTION

The widespread manufacture of personal computers has led to a substantial degree of uniformity of size and configuration for many circuit boards used in such computers. Such boards, for example, include communication boards, graphics boards and disk controller boards. Circuit boards which have attained a de facto "standard" status include those used in the IBM PC-AT personal computer. These size and configuration similarities result in similarity in the overall dimensions of the electronic enclosures for most personal computers.

For reasons of compactness it would be advantageous to reduce the height of the electronics enclosure used in personal computers. This would also permit the use of standard personal computer technology in products other than personal computers which might require a smaller size of electronic enclosures, such as a compact point of sale retail terminal, for example.

SUMMARY OF THE INVENTION

This invention relates to a housing for electronic components, and more particularly relates to such a housing having a reduced height while still accommodating circuit boards of standard size and configuration.

In accordance with one embodiment of the present invention, a housing for electronic components comprises a lower housing means having a base portion and engaging means for engaging an upper housing means; said upper housing means having a cover portion and means for receiving the engaging means of the lower housing means; a first circuit board secured to the base portion of the lower housing means and having circuit board receptacle means on an upper surface thereof; a vertical frame secured to said upper housing means and depending therefrom; a bus board secured in vertical orientation to said vertical frame, having connection means at its lower edge to engage the receptacle means on the first circuit board, and also having a plurality of horizontally disposed circuit board receptacle means located on both sides of said bus board; and a plurality of additional circuit boards, each having connector means atone edge thereof adapted to engage the horizontally disposed circuit board receptacle means on the bus board, at least certain of said additional circuit boards having a width extending outwardly from the connector means which is greater than the vertical distance between said first circuit board and said cover portion.

It is accordingly an object of the present invention to provide a compact housing for electronic components.

Another object is to provide a housing for electronic components having a reduced height while still accommodating circuit boards of standard size and configuration.

Another object is to provide a housing for electronic components which includes a base circuit board, a vertical bus board electrically coupled to said base circuit board, and at least one horizontally oriented additional board electrically coupled to the vertical bus board.

With these and other objects, which will become apparent from the following description, in view, the invention includes certain novel features and combinations, a preferred form or embodiment of which is hereafter described with reference to the drawings which accompany and form a part of this specification.

DESCRIPTION OF THE PREFERRED EMBODIMENT

Figure 1:
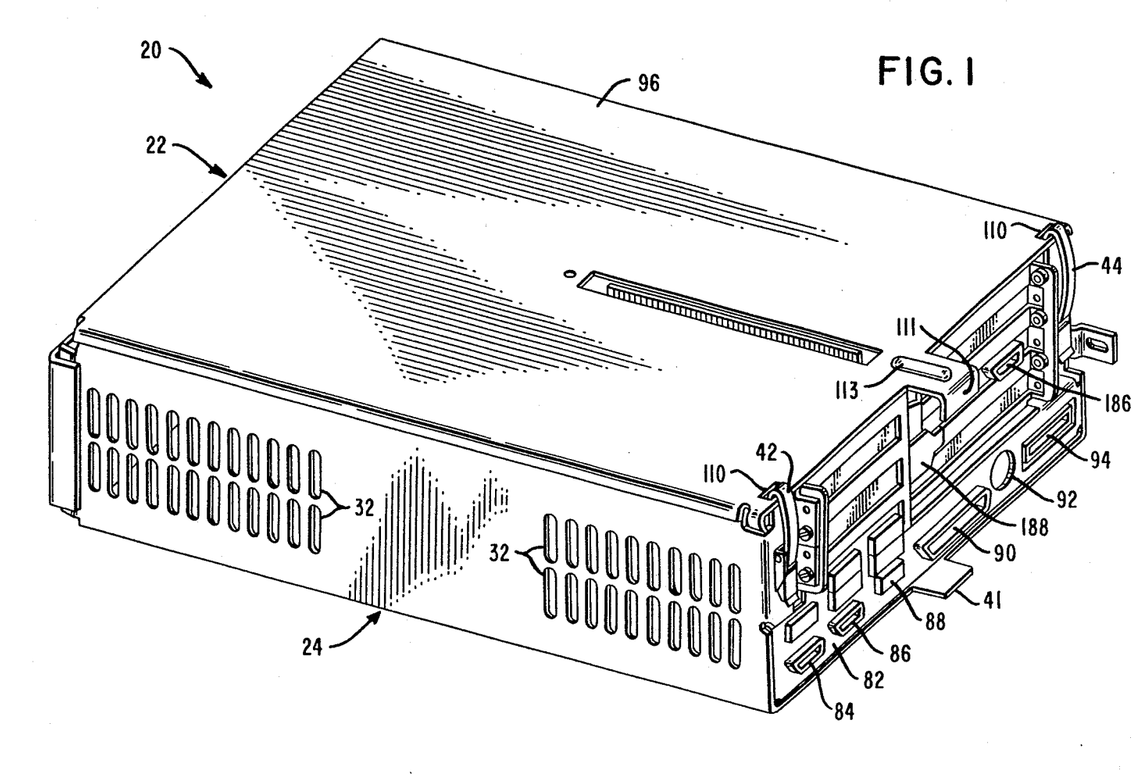
FIG. 1 is a perspective view of the exterior of the housing for electronic components of the present invention.

Referring now to FIG. 1, shown there is a housing 20 for electronic components. As may also be seen in FIGS. 2 and 3, the housing 20 includes an upper housing member 22 and a lower housing member 24.

Figure 2:
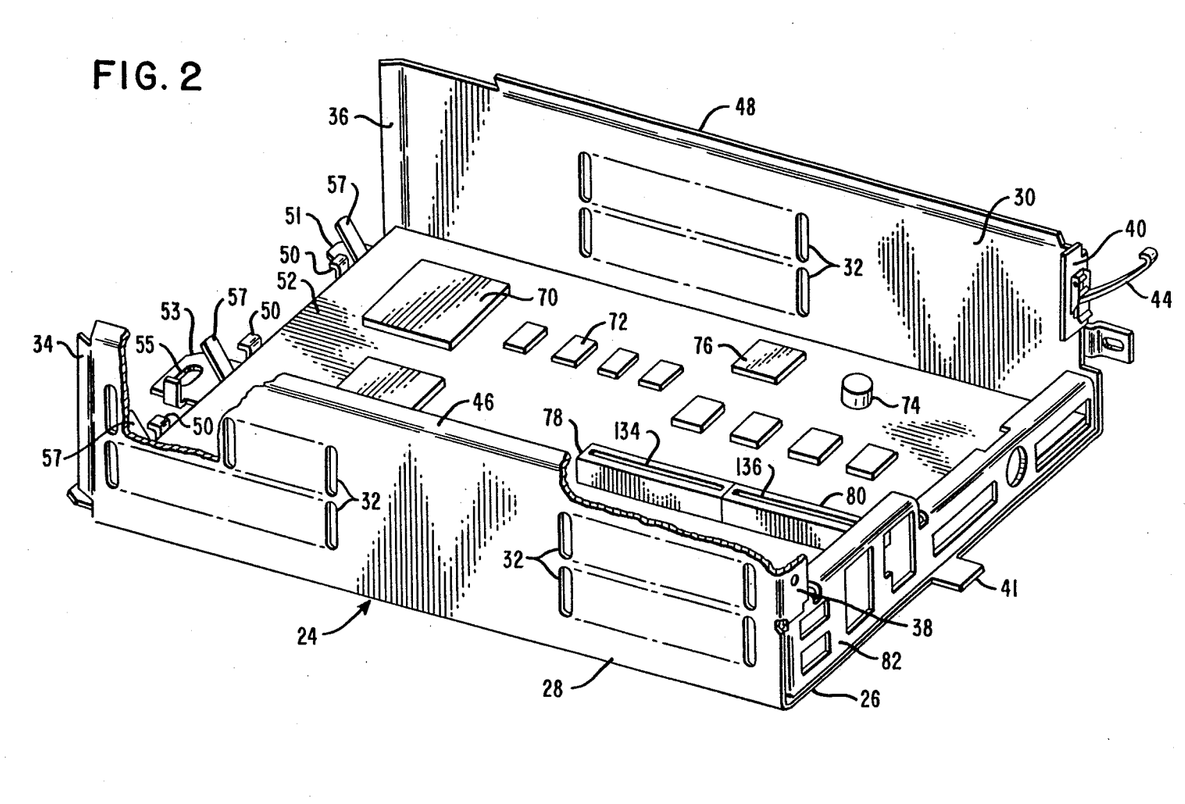
FIG. 2 is a perspective view of the lower housing member.

The lower housing member 24 includes a base 26 and two side walls 28 and 30. The side walls are provided with slots 32 to provide ventilation so that temperatures within the enclosure will not reach excessive levels. At one end, hereinafter called the front end, the side walls 28 and 30 are turned slightly inwardly to provide end elements 34 and 36. At the other end, hereinafter called the rear end, tabs 38 and 40, which are integral with the side walls 28 and 30, are turned inwardly at ninety degrees to provide a mounting for latches 42 and 44, which function to secure the upper housing member 22 and the lower housing member 24 together, as will subsequently be described in greater detail. At the rear end of the lower housing member 24, a tab 41 is provided, which may be readily grasped when it is desired to separate the upper housing member 22 from the lower housing member 24. The upper edges of the side walls 28 and 30 are also turned slightly inwardly to provide upper edge elements 46 and 48. As best shown in FIG. 2, at the end of the base 26 adjacent to the elements 34 and 36 are located three projections 50, which engage with slots in the upper housing member 22, as will subsequently be described in greater detail. A tab 51 at one end of the front edge of the base 26, and a similar tab (not shown) near the other end of the front edge of the base 26 are provided to facilitate proper location of the housing 20 in a cabinet (not shown). A centrally located projection 53 provides means whereby the housing 20 is retained in the cabinet. A fastener (not shown) cooperates with a slot 55 in said projection 53 to achieve said retention. Three flexible spring elements 57 are also attached to the front edge of the base 26. These elements engages the end wall of the upper housing member 22 when the members 22 and 24 are assembled, in order to assure an electrical grounding contact between the two members.

A processor circuit board 52 is secured to the base 26 by a plurality of downwardly extending fasteners 54 (FIGS. 7 and 8), which engage with slots 56 located in circular raised areas 58 in the base 26. The slots 56 are wider at their open ends than at their closed ends in order to facilitate initial placement of the fasteners 54 therein. Each fastener 54 has a resilient upper portion 58 which is pushed through an aperture 60 in the board 52 and then springs outwardly to retain the fastener 54 in place. A central shaft 62 of the fastener 54 has a retainer 64 at the upper end thereof which engages the lower surface of the board 52 when the fastener 54 is secured to the base 26. A flange 66 and a cap 68 on the shaft 62 define therebetween a portion of the shaft 62 which engages the slot 56 in the raised area 58 of the base 26.

Figure 3:
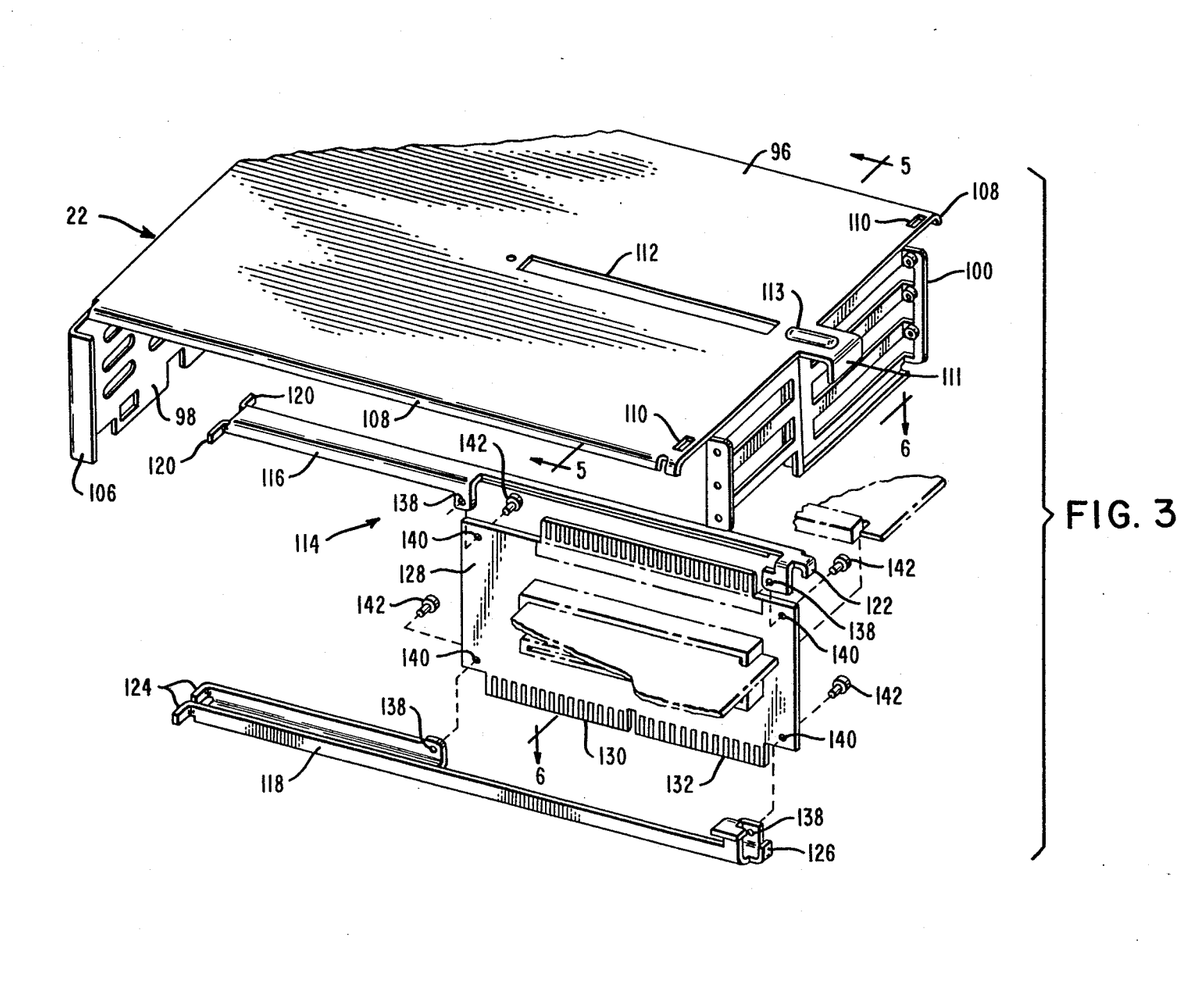
FIG. 3 is an exploded perspective view of the upper housing member, also showing an internal frame and circuit boards.

The processor board 52 is a circuit board on which are mounted integrated circuit elements and other components such as those identified by reference characters 70, 72, 74 and 76 in FIG. 3. These components, together with conducting paths connecting them, comprise a substantial part of the circuitry included in the personal computer or other apparatus which includes the enclosure 20. Also mounted on the board are a pair of receptacles 78 and 80 which receive the edge connectors of one or more additional circuit boards, which are positioned in perpendicular relationship to the board 52, as will be subsequently described in greater detail. At its right end, as viewed in FIGS. 1 and 3, the processor board 52 has attached thereto, by screws or other suitable securing means (not shown), a face member 82 which is apertured to accommodate a number of plugs or receptacles for interfacing electronic components within the housing 20 with electrical circuitry outside the housing 20. These plugs or receptacles can be employed for any suitable interconnection. In the illustrated embodiment, for example, a plug 84 is provided for communications, a plug 86 is provided for the CRT, a plug 88 is provided for a cash drawer, a plug 90 is provided for a printer module, a plug 92 is provided for a keyboard, and a plug 94 is provided for a power supply.

The upper housing member 22 includes a flat cover portion 96, a depending integral front wall 98, and a rear frame 100, which is secured to the cover portion 96 by welding or other suitable means. The rear wall 98 is provided with slots 102 for ventilating purposes, and is also provided with slots 104 which engage with the projections 50 on the lower housing member 24 for securing the members 22 and 24 together. End walls 106 on the front wall 98 are bent ninety degrees from the wall 98 and overlie the end elements 34 and 36 of the walls 28 and 30 of the lower housing member 24 when the members 22 and 24 are in assembled relationship.

The side edges of the flat cover portion 96 are turned downwardly to form flanges 108 which overlie upper edge elements 46 and 48 when the upper and lower housing members 22 and 24 are in assembled relationship.

Two slots 110 are formed near the rear edge of the cover portion 96 and are positioned to receive upper hook portions of latches 42 and 44. The latches 42 and 44 are of a toggle type of construction, so that when the hook portions of these latches are engaged in the slots 110 and the latches 42 and 44 are moved downwardly by toggle action, the upper housing member 22 is latched securely to the lower housing member 24. A tab 111, which extends from the rear edge of the cover portion 96, includes an integral stiffened portion 113, and may be readily grasped at the same time that the tab 41 on the lower housing members 24 is grasped, in order to separate the upper and lower housing members.

A large central slot 112 is also provided in the cover portion 96 and permits engagement by an external electrical connector with a vertically positioned circuit board which is located within the housing 20, as will subsequently be disclosed in greater detail.

Secured to the underside of the cover portion 96, to the rear wall 98, and to the frame 100 is a vertical circuit board frame 114 which includes an upper element 116 and a lower element 118. The upper element 116 may be secured to the lower surface of the cover portion 96 by welding, for example, and may be secured to the rear wall 98 and to the frame 100 by tabs 120 and 122, respectively, also by welding. The lower element 118 may be secured to the rear wall 98 and to the frame 100 by tabs 124 and 126, respectively, also by welding.

The frame 114 is provided to hold a bus circuit board 128 in a central vertical position within the housing 20 so that connectors 130, 132 on the bottom edge of said board will engage the slots 134, 136 of the receptacles 78, 80 on the board 52 when the upper and lower housing members 22, 24 are in assembled relationship. Apertures 138 in the frame elements 116 and 118 are positioned to register with apertures 140 in the circuit board 128 when said board is properly positioned, and resilient connectors 142 may then be used to secure the board 128 in place on the frame 114.

The bus board 128 serves a busing function in providing communication between a plurality of additional circuit boards, which are plugged into the board 128, and the processor board 52, into which the bus board 128 is plugged by the connectors 130, 132 and the receptacles 78, 80, as previously described. A plurality of receptacles, such as the receptacles 144, 146, 148, 150 and 152 (see FIG. 5), are secured to the board 128 in a horizontal orientation, so that additional circuit boards, such as the boards 154, 156, 158, 160 and 162, when plugged into the receptacles, are located in horizontal planes, parallel to the plane of the processor board 52, within the housing 20.

Figure 5:
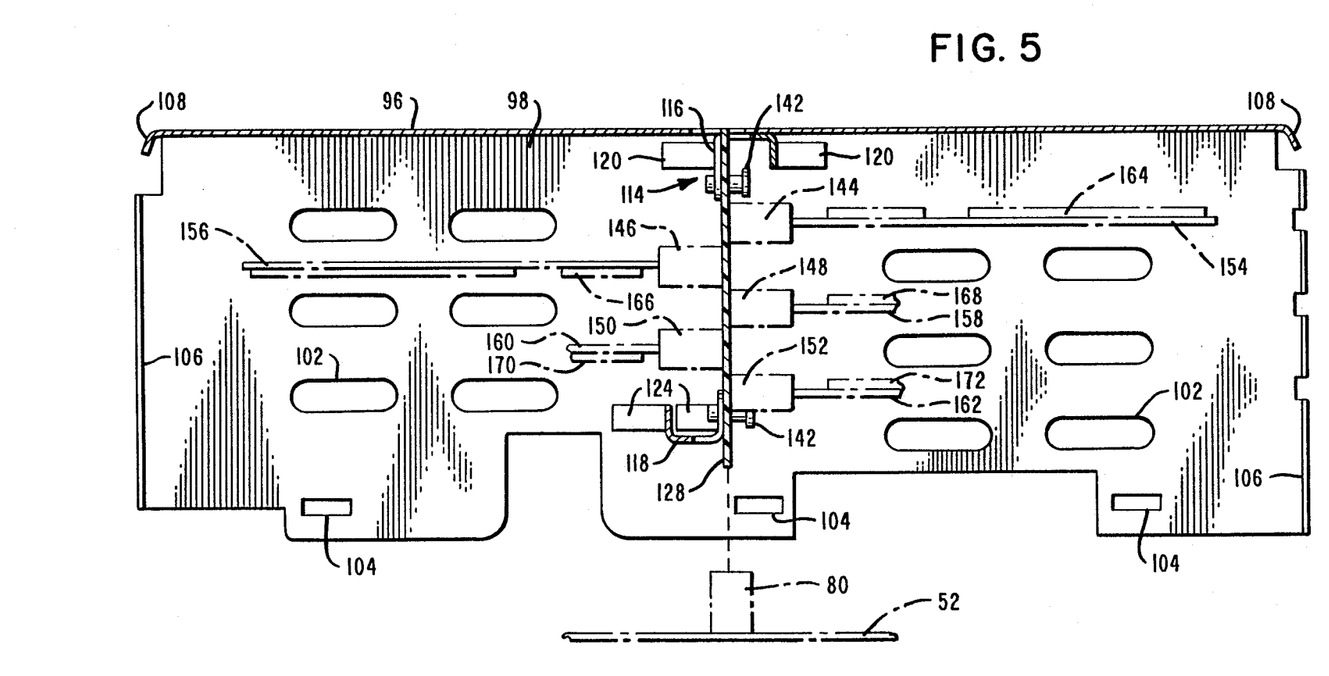
FIG. 5 is a sectional view taken along line 5—5 of FIG. 3.

It will be noted that the boards 154, 156, 158, 160 and 162 are mounted on both sides of the bus board 128 and that the electrical components mounted on the boards, such as the components 164, 166, 168, 170 and 172, are mounted on opposite sides of adjacent boards. Both of these arrangements tend to maximize the number of boards which can be placed horizontally in the space between the processor board 52 and the cover portion 96.

It will also be noted that the boards 154, 156, 158, 160 and 162 can be of greater width, in their dimension extending away from the board 128, than they could be if they were mounted vertically and plugged directly into the processor board 52. Looking at the arrangement another way, it permits the upper and lower surfaces of the housing 20 to be closer together in a vertical dimension for a given width of boards 154, 156, 158, 160 and 162 than would be the case if the boards were mounted vertically. This enables standard sizes of boards used in personal computers, such as the IBM PCAT, for example, to be employed in a housing which is smaller in its vertical dimension than would normally be possible.

Figure 4:
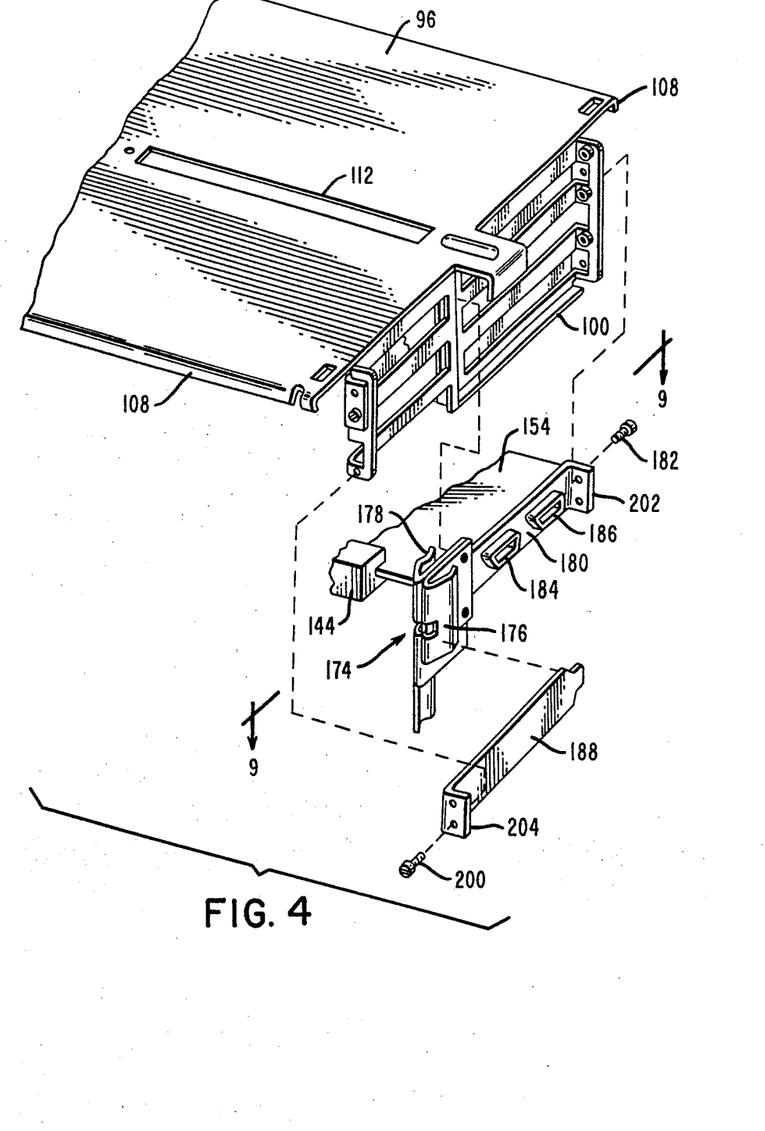
FIG. 4 is a fragmentary exploded perspective view showing one end of the upper housing member, and grounding elements associated therewith.
Figures 6, 7, 8:
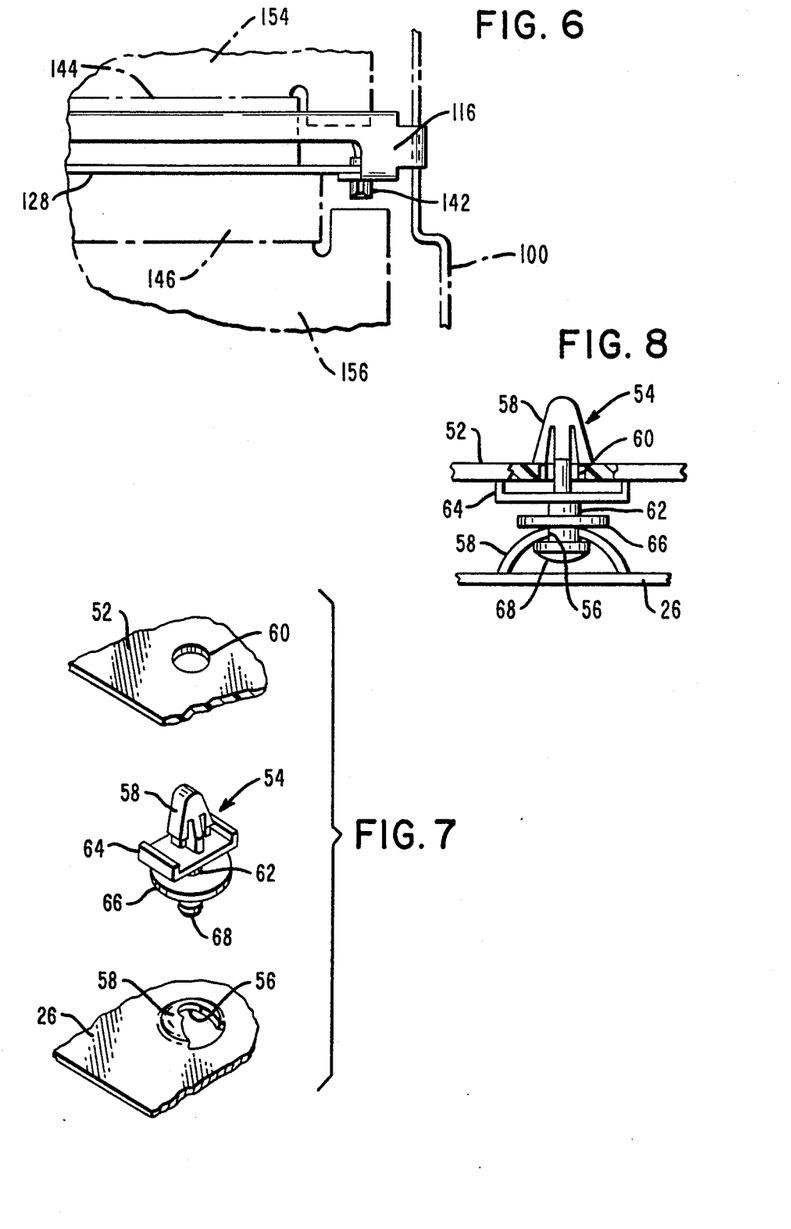
FIG. 6 is a sectional view, taken along line 6—6 of FIG. 3.
FIG. 7 is a fragmentary exploded perspective view, showing a fastening mechanism for securing a circuit board to the base of the lower housing member.
FIG. 8 is a sectional view of the fastening mechanism of FIG. 7.
Figure 9:
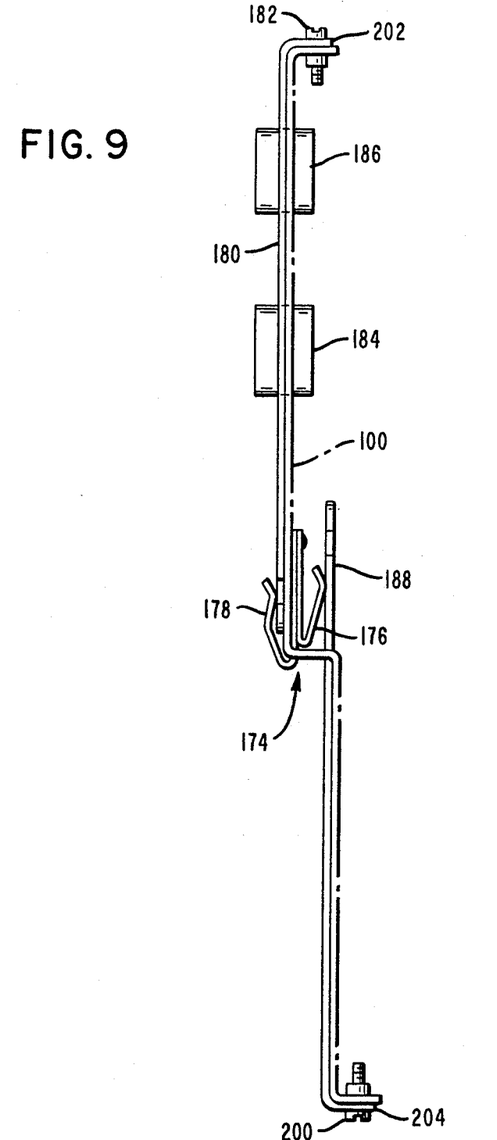
FIG. 9 is a fragmentary sectional view taken along line 9—9 of FIG. 4, showing the ground planes in assembled relation to the ground connection.

Referring now to FIG. 6, it will also be noted that the receptacles 144, 148 and 152 on one side of the bus board 128 are set back from the front vertical edge of the board 128 a lesser distance than the receptacles 146 and 150 on the other side of the bus board 128. This is to permit ground plates associated with the boards to overlap an engaging a central ground connection 174 which is mounted on the frame 100. As is also shown in FIGS. 4 and 9, the ground connection 174 comprises a pair of U-shaped elements 176 and 178 which are secured together. A ground plate 180 is electrically connected to the circuit board 154 and has an angled end portion 202 which is connected to the frame 100 by suitable means, such as screws 182. Apertures in the ground plate 180 are surrounded by connectors 184 and 186 which may be coupled to the shielding of external circuitry. Connectors (not shown), electrically connected to the circuit board 154, extend through the apertures in the ground plate 180 for connection to external electrical conductors. The free end of the ground plate 180 electrically engages an internal surface of the U-shaped element 178. In a similar manner, a ground plate 188 is connected to the board 156. An angled end portion 204 of the plate 188 is connected by screws 200 to the frame 100. The free end of the ground plate 188 electrically engages the outer surface of the U-shaped element 176. It will be seen that providing a structure in which the free ends of the ground plates 180 and 188, which are associated with the circuit boards 154 and 156, overlap enhances the compactness of the housing 20.

While the form of the invention illustrated and described herein is particularly adapted to fulfill the objects aforesaid, it is to be understood that other and further modifications within the scope of the appended claims may be made without departing from the spirit of the invention.

What is claimed is:

1. A housing for electronic components, comprising:
 a lower housing means having a base portion and engaging means for engaging an upper housing means;
 said upper housing means having a cover portion and means for receiving the engaging means of the lower housing means;
 a first circuit board secured to the base portion of the lower housing means and having circuit board receptacle means on an upper surface thereof;
 a vertical frame secured to said upper housing means and depending therefrom;
 a bus board secured in vertical orientation to said vertical frame, having connection means at its lower edge to engage the receptacle means on the first circuit board, and also having a plurality of horizontally disposed circuit board receptacle means located on both sides of said bus board; and
 a plurality of additional circuit boards, each having connector means at one edge thereof adapted to engage the horizontally disposed circuit board receptacle means on the bus board, at least certain of said additional circuit boards having a width extending outwardly from the connector means which is greater than the vertical distance between said first circuit board and said cover portion.

2. A housing for electronic components, comprising:
 a lower housing member having a base, two opposite side walls, latch means adjacent one end of said side walls, and engaging means at the end of the base opposite said latch means;
 a first circuit board secured to the base of the lower housing member and having circuit board receptacle means on an upper surface thereof;
 an upper housing member having an end wall with engaging means thereon adapted to engage the engaging means of the lower housing member, and having retaining means at the other end of said upper housing member adapted to engage the latch means of the lower housing member;
 a vertical frame secured to said upper housing member and depending therefrom;
 a bus board secured in vertical orientation to said vertical frame, having connector means at its lower edge to engage the receptacle means on the first circuit board, and also having at least one horizontally disposed printed circuit board receptacle means located thereon; and
 at least one additional printed circuit board having connector means at one edge thereof adapted to engage one of the at least one horizontally disposed printed circuit board receptacle means on the bus board.

3. A housing for electronic components, comprising:
 a lower housing member having a base, two opposite side walls, latch means adjacent one end of said side walls, and engaging means at the end of the base opposite said latch means;
 a first circuit board secured by securing means to the base of the lower housing member and having circuit board receptacle means on an upper surface thereof;
 an upper housing member having an end wall at one end thereof with engaging means thereon adapted to engage the engaging means of the lower housing member, and having retaining means at the other end of said upper housing member adapted to engage the latch means of the lower housing member;
 a vertical frame secured to said upper housing, member and depending therefrom;
 a bus board secured in vertical orientation to said vertical frame, said bus board having connector means at its lower edge to engage the receptacle means on the first circuit board, and also having a plurality of horizontally disposed printed circuit board receptacle means located on both sides of said bus board; and
 a plurality of additional circuit boards, each having connector means at one edge thereof adapted to engage the horizontally disposed printed circuit board receptacle means on the bus board.

4. The housing for electronic components of claim 3, in which said additional circuit boards which are connected to receptacle means on one side of the bus board are oriented with board components on their upper surfaces, and in which said additional circuit boards which are connected to receptacle means on the other side of the bus board are oriented with board components on their lower surfaces.

5. The housing for electronic components of claim 3, also including a grounding connection positioned at one end of the housing for electronic components, further including a grounding plate electrically coupled to each additional circuit board, and in which the receptacle means on one side of the bus board are offset from the receptacle means on the other side of the bus board to permit the grounding plates coupled to the additional circuit boards on one side of the bus board to overlap the grounding plates coupled to the circuit boards on the other side of the bus board to enable all of the grounding plates to operatively engage the grounding connection.

6. The housing for electronic components of claim 3, in which the engaging means on the lower housing member comprises a plurality of projections extending outwardly from said base, and the engaging means on the upper housing member comprises a plurality of slots in the end wall positioned to engage said projections.

7. The housing for electronic components of claim 3, in which the retaining means on the upper housing member comprises a plurality of slots and the latch means on the lower housing means comprises a corresponding plurality of hooks to engage said slots and a plurality of toggles connected to said hooks and to said lower housing member to enable said upper housing member to be drawn into close engagement with said lower housing member.

8. The housing for electronic components of claim 3, in which the securing means for securing said first circuit board to the base of the lower housing member comprises at least one projection complex to the lower surface of said first circuit board adapted to engage a corresponding at least one slot in the base.

9. The housing for electronic components of claim 3, in which the interior height of the assembled upper and lower housing members is less than the widths of the additional circuit boards.

10. The housing for electronic components of claim 3, in which the upper edges of the side walls of the lower housing member are turned inwardly, and in which the side edges of the upper housing member are turned down so as to overlap the upper edges of the side walls of the lower housing member when the upper housing member is assembled onto the lower housing member.

11. The housing for electronic components, of claim 3, in which the upper housing member is slotted to provide exterior access to the upper edge of the bus board.

12. The housing for electronic components of claim 3, in which the edges of the side walls adjacent the engaging means of the lower housing member are turned inwardly, and in which the vertical ends of the end wall of the upper housing member are turned to overlap said edges of said side walls when the upper housing member is assembled onto the lower housing member.

13. The housing for electronic components of claim 5, in which said grounding connection comprises a pair of joined u-shaped elements, positioned to engage the grounding plates of the additional circuit boards.

14. The housing for electronic components of claim 3, in which said lower housing member and said upper housing member are metal and provide electromagnetic shielding for the electronic components within the housing.

15. The housing for electronic components of claim 3, in which said vertical frame is centrally located with respect to the sides of the upper housing member, and in which the circuit board receptacle means on the first circuit board is centrally located with respect to the sides of the lower housing member.

16. The housing for electronic components of claim 3, also including a support member secured to the other end of the upper housing member, a grounding connection secured to said support member, and grounding plates electrically coupled to each additional circuit board, said plates being secured to said support member and engaging with said grounding connection.

17. The housing for electronic components of claim 16, in which the receptacle means on one side of the bus board are offset from the receptacle means on the other side of the bus board to permit the grounding plates coupled to the additional circuit boards on one side of the bus board to overlap the grounding plates coupled to the additional circuit boards on the other side of the bus board to enable all of the grounding plates to operatively engage the grounding connection.

18. The housing for electronic components of claim 3 in which said additional circuit boards are of standard personal computer dimensions in length and width.

19. The housing for electronic components of claim 3 in which said additional circuit boards are of PC-AT compatible dimensions in length and width.

20. The housing for electronic components of claim 3, also including tabs at one end of each of the upper and lower housing members to facilitate the separation of said housing members by providing means for the grasping of each of said upper and lower housing members.

21. The housing for electronic components of claim 3, also including locating means at one end for aiding the proper location of said housing in a cabinet, and further including retaining means for retaining said housing in a cabinet.

22. The housing for electronic components of claim 3, also including resilient conductive means mounted on the lower housing member engageable with the upper housing member when they are assembled, to provide an electrical path connecting the two housing members.

* * * * *

UNITED STATES PATENT AND TRADEMARK OFFICE
CERTIFICATE OF CORRECTION

PATENT NO. : 4,901,205

DATED : February 13, 1990

INVENTOR(S) : Donald E. Landis et al.

It is certified that error appears in the above-identified patent and that said Letters Patent is hereby corrected as shown below:

Column 6, line 40, delete the comma after "housing".

Column 7, line 24, delete "complex" and substitute --coupled--.

Column 7, line 38, delete the comma after "components".

Signed and Sealed this

Nineteenth Day of February, 1991

Attest:

HARRY F. MANBECK, JR.

*Attesting Officer*  *Commissioner of Patents and Trademarks*